(12) United States Patent
Wu et al.

(10) Patent No.: US 11,774,673 B2
(45) Date of Patent: Oct. 3, 2023

(54) OPTICAL COMMUNICATION PACKAGE STRUCTURE AND METHOD FOR MANUFACTURING THE SAME

(71) Applicant: Advanced Semiconductor Engineering, Inc., Kaohsiung (TW)

(72) Inventors: Cheng-Hsuan Wu, Kaohsiung (TW); Yung-Hui Wang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 17/719,277

(22) Filed: Apr. 12, 2022

(65) Prior Publication Data

US 2022/0236480 A1 Jul. 28, 2022

Related U.S. Application Data

(63) Continuation of application No. 16/528,331, filed on Jul. 31, 2019, now Pat. No. 11,300,727.

(51) Int. Cl.
*G02B 6/12* (2006.01)
*G02B 6/42* (2006.01)

(52) U.S. Cl.
CPC ............ *G02B 6/12* (2013.01); *G02B 6/4204* (2013.01); *G02B 2006/12061* (2013.01)

(58) Field of Classification Search
None
See application file for complete search history.

(56) References Cited

U.S. PATENT DOCUMENTS

| 4,842,699 A * | 6/1989 | Hua ...................... H01L 23/481 257/E21.597 |
| 6,110,825 A | 8/2000 | Mastromatteo et al. |
| 7,838,337 B2 * | 11/2010 | Marimuthu ......... H01L 21/6835 257/E21.511 |
| 8,406,581 B2 | 3/2013 | Hamamura et al. |

(Continued)

OTHER PUBLICATIONS

Final Office Action for U.S. Appl. No. 16/528,331, dated Feb. 18, 2021, 15 pages.

(Continued)

*Primary Examiner* — Rhonda S Peace
(74) *Attorney, Agent, or Firm* — FOLEY & LARDNER LLP

(57) ABSTRACT

An optical communication package structure includes a wiring structure, at least one via structure, a redistribution structure, at least one optical device and at least one electrical device. The wiring structure includes a main portion and a conductive structure disposed on an upper surface of the main portion. The main portion defines at least one through hole extending through the main portion. The via structure is disposed in the at least one through hole of the main portion and electrically connected to the conductive structure. The redistribution structure is disposed on a lower surface of the main portion and electrically connected to the via structure. The optical device is disposed adjacent to the upper surface of the main portion and electrically connected to the conductive structure. The electrical device is disposed on and electrically connected to the conductive structure.

7 Claims, 18 Drawing Sheets

(56) References Cited

U.S. PATENT DOCUMENTS

| | | | |
|---|---|---|---|
| 8,541,883 B2 * | 9/2013 | Cheng | H01L 21/76898 257/773 |
| 8,937,387 B2 | 1/2015 | Huang et al. | |
| 9,158,081 B2 | 10/2015 | Jo et al. | |
| 10,109,588 B2 | 10/2018 | Jeong et al. | |
| 10,566,287 B1 | 2/2020 | Ding et al. | |
| 11,300,727 B2 * | 4/2022 | Wu | G02B 6/43 |
| 2004/0259292 A1 | 12/2004 | Beyne et al. | |
| 2010/0006330 A1 | 1/2010 | Fu et al. | |
| 2010/0133704 A1 | 6/2010 | Marimuthu et al. | |
| 2010/0230760 A1 | 9/2010 | Hung | |
| 2010/0308443 A1 * | 12/2010 | Suthiwongsunthorn | H01L 24/94 438/618 |
| 2012/0056316 A1 * | 3/2012 | Pagaila | H01L 24/97 257/737 |
| 2012/0074585 A1 * | 3/2012 | Koo | H01L 23/147 257/774 |
| 2013/0075902 A1 * | 3/2013 | Chow | H01L 23/3135 257/737 |
| 2013/0207260 A1 | 8/2013 | Hsu et al. | |
| 2014/0091473 A1 | 4/2014 | Len et al. | |
| 2014/0319678 A1 * | 10/2014 | Pagaila | H01L 23/5384 257/737 |
| 2018/0074270 A1 | 3/2018 | Pinguet et al. | |
| 2020/0135650 A1 | 4/2020 | Kuo et al. | |
| 2022/0236480 A1 * | 7/2022 | Wu | G02B 6/4204 |

OTHER PUBLICATIONS

Non-Final Office Action for U.S. Appl. No. 16/528,331, dated Jun. 28, 2021, 16 pages.

Non-Final Office Action for U.S. Appl. No. 16/528,331, dated Sep. 22, 2020, 16 pages.

Notice of Allowance for U.S. Appl. No. 16/528,331, dated Dec. 8, 2021, 9 pages.

\* cited by examiner

OPTICAL COMMUNICATION PACKAGE STRUCTURE AND METHOD FOR MANUFACTURING THE SAME

CROSS-REFERENCE TO RELATED APPLICATION

This application is a continuation of U.S. patent application Ser. No. 16/528,331 filed Jul. 31, 2019, the contents of which is incorporated herein by reference in its entirety.

BACKGROUND

1. Field of the Disclosure

The present disclosure relates to a package structure and a manufacturing method, and to an optical communication package structure including at least one via structure for vertical electrical connection and a method for manufacturing the optical communication package structure.

2. Description of the Related Art

In a comparative optical communication system, a photonic-electronic hybrid package structure may be used to be a receiver, a transmitter or a transceiver. The electrical connection in the hybrid package structure is generally through wire bonding. However, the lengths of the bonding wires are too long resulting in a further decrease in transmission speed while power consumption is increased.

SUMMARY

In some embodiments, an optical communication package structure includes a wiring structure, at least one via structure, a redistribution structure, at least one optical device and at least one electrical device. The wiring structure includes a main portion and a conductive structure disposed on an upper surface of the main portion. The main portion defines at least one through hole extending through the main portion. The via structure is disposed in the at least one through hole of the main portion and electrically connected to the conductive structure. The redistribution structure is disposed on a lower surface of the main portion and electrically connected to the via structure. The optical device is disposed adjacent to the upper surface of the main portion and electrically connected to the conductive structure. The electrical device is disposed on and electrically connected to the conductive structure.

In some embodiments, a method for manufacturing an optical communication package structure includes: (a) providing a wafer including a main portion and a conductive structure disposed on an upper surface of the main portion; (b) forming at least one through hole extending through the main portion to expose a portion of the conductive structure; (c) forming at least one via structure in the at least one through hole of the main portion and forming a redistribution structure on a lower surface of the main portion; and (d) electrically connecting at least one electrical device to the conductive structure.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
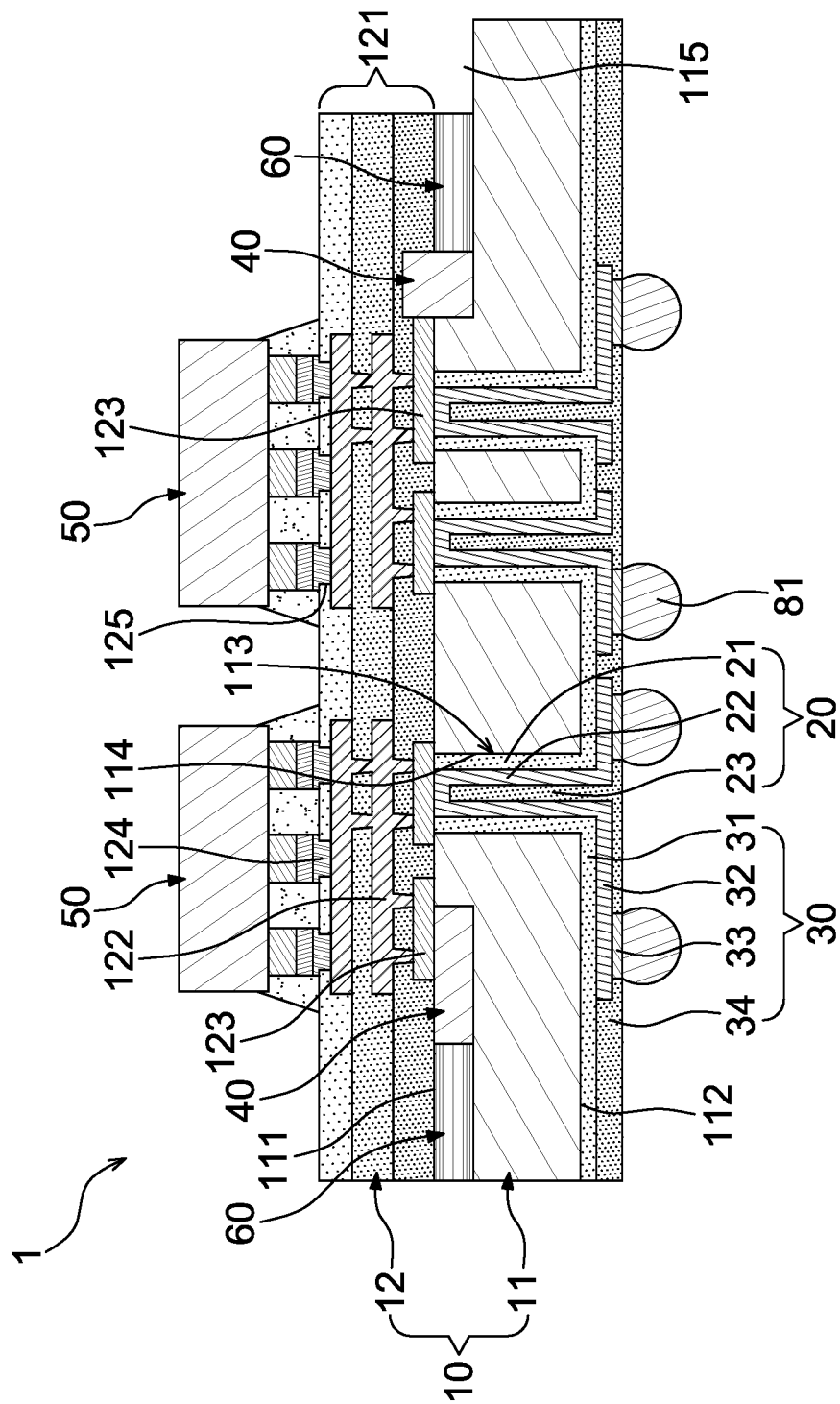
FIG. 1 illustrates a cross-sectional view of an optical communication package structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In a comparative optical communication package structure, a through silicon via (TSV) technology is used to increase transmission speed. However, the through silicon via is difficult to manufacture together with integrated circuits of a wafer. This is due to the multi-stage heating process of manufacturing the integrated circuits of the wafer may damage the through silicon via.

At least some embodiments of the present disclosure provide for an optical communication package structure which has improved transmission speed and reduced power consumption. In some embodiments, the optical communication package structure includes at least one via structure and a redistribution structure electrically connected to the via structure. At least some embodiments of the present disclosure further provide for techniques for manufacturing the optical communication package structure to prevent the via structure from damaging or missing.

FIG. 1 illustrates a cross-sectional view of an optical communication package structure 1 according to some embodiments of the present disclosure. The optical communication package structure 1 includes a wiring structure 10, at least one via structure 20, a redistribution structure 30, at least one optical device 40, at least one electrical device 50, at least one waveguide 60 and a plurality of solder bumps 81. In some embodiments, the optical communication package structure 1 may be a photonic-electronic hybrid package structure.

The wiring structure 10 includes a main portion 11 and a conductive structure 12. The main portion 11 has an upper surface 111 and a lower surface 112 opposite to the upper surface 11, and defines at least one through hole 113 extending through the main portion 11 and at least one groove 115 recessed from the upper surface 111. In some embodiments, an aspect ratio of the through hole 113 may be less than or about equal to 1.66. In some embodiments, a material of the main portion 11 may include silicon.

The conductive structure 12 is disposed on the upper surface 111 of the main portion 11. The conductive structure 12 includes a dielectric structure 121, at least one circuit layer 122, at least one bonding pad 123 and a plurality of metal bumps 124. The dielectric structure 121 covers the upper surface 111 of the main portion 11, and includes a plurality of dielectric layers stacked on one another. A material of the dielectric layers is different from a material of the main portion 11. The at least one circuit layer 122 is embedded in the dielectric layers of the dielectric structure 121. In some embodiments, the at least one circuit layer 122 may include a plurality of circuit layers 122 electrically connected to each other through a plurality of inner vias. The at least one bonding pad 123 is disposed adjacent to or disposed on the upper surface 111 of the main portion 11 and electrically connected to the circuit layer 122 through the inner vias. In some embodiments, the at least one bonding pad 123 may include a plurality of bonding pads 123 disposed adjacent to or exposed from a lower surface of the conductive structure 12. In some embodiments, the bonding pads 123 may be a portion of a circuit layer. The metal bumps 124 are disposed adjacent to an upper surface of the conductive structure 12. As shown in FIG. 1, the metal bumps 124 are disposed on and electrically connected to the topmost circuit layer 122. In some embodiments, the dielectric structure 121 defines a plurality of openings 125 to expose a portion of the topmost circuit layer 122, and the metal bumps 124 may be disposed in the openings 125 and on the topmost circuit layer 122. Further, the metal bumps 124 may protrude from the upper surface of the conductive structure 12.

The via structure 20 is disposed in the at least one through hole 113 of the main portion 11 and electrically connected to the conductive structure 12. Thus, the via structure 20 may extend through the main portion 11. The via structure 20 includes a first passivation layer 21, a metal layer 22 and a second passivation layer 23. The first passivation layer 21 is disposed in the through hole 113 of the main portion 11 and covers a side wall 114 of the through hole 113. The first passivation layer 21 may be formed from a dry film (e.g., a negative photoresist), a silicon oxide, or a silicon nitride. The metal layer 22 covers the first passivation layer 21 and is electrically connected to the at least one bonding pad 123. The metal layer 22 may be formed from copper or alloy. A top surface of the metal layer 22 is substantially coplanar with a top surface of the first passivation layer 21. That is, the first passivation layer 21 does not cover the top surface of the metal layer 22. Thus, the top surface of the metal layer 22 is exposed from the first passivation layer 21 to contact the bonding pad 123. In some embodiments, the top surface of the metal layer 22, the top surface of the first passivation layer 21 are substantially coplanar with the upper surface 111 of the main portion 11. The metal layer 22 defines a central hole, and the second passivation layer 23 fills the central hole defined by the metal layer 22. The second passivation layer 23 may be formed from a dry film. The material of the second passivation layer 23 may be same as or different from the material of the first passivation layer 21.

The redistribution structure 30 is disposed on the lower surface 112 of the main portion 11 and electrically connected to the via structure 20. The redistribution structure 30 includes a first passivation layer 31, a redistribution layer 32, a plurality of bonding pads 33 and a second passivation layer 34. The first passivation layer 31 is disposed on the lower surface 112 of the main portion 11. For example, the first passivation layer 31 may be formed from a dry film, a silicon oxide, or a silicon nitride. The redistribution layer 32 is disposed on the first passivation layer 31 and electrically connected to the metal layer 22 of the via structure 20. For example, the redistribution layer 32 may be formed from copper or alloy. The bonding pads 33 are disposed on and electrically connected to the redistribution layer 32. The second passivation layer 34 covers the redistribution layer 32 and the first passivation layer 31. For example, the second passivation layer 34 may be formed from a dry film.

In some embodiments, the first passivation layer 31 of the redistribution structure 30 and the first passivation layer 21 of the via structure 20 may be formed integrally and concurrently The redistribution layer 32 of the redistribution structure 30 and the metal layer 22 of the via structure 20 may be formed integrally and concurrently The second passivation layer 34 of the redistribution structure 30 and the second passivation layer 23 of the via structure 20 may be formed integrally and concurrently.

The optical device 40 may be, for example, a photo detector, a laser diode or a modulator. The optical device 40 is disposed adjacent to the upper surface 111 of the main portion 11 and electrically connected to the at least one bonding pad 123 of the conductive structure 12. In some embodiments, the dielectric structure 121 of the conductive structure 12 may cover the optical device 40. In some embodiments, the optical device 40 may be disposed adjacent to the boundary between the dielectric structure 121 of the conductive structure 12 and the main portion 11. Thus, the optical device 40 may be embedded in the dielectric structure 121 of the conductive structure 12 and/or the main portion 11.

The electrical device 50 may be, for example, a trans-impedance amplifier (TIA) or a driver. The electrical device 50 is disposed on and electrically connected to the conductive structure 12 by flip-chip bonding. In some embodiments, the electrical device 50 may be bonded to the metal bumps 124 of the conductive structure 12. In some embodiments, the electrical device 50 may perform vertical electrical connection through the via structure 20 and the redistribution structure 30, thereby resulting in an increase in transmission speed while power consumption may be decreased. This is due to the via structure 20 and the redistribution structure 30 shorten the electric transmission path. In addition, the via structure 20 and the redistribution structure 30 may reduce a volume of the optical communication package structure 1 about 30%.

The waveguide 60 is disposed adjacent to the upper surface 111 of the main portion 11 and corresponds to the optical device 40. In some embodiments, the dielectric structure 121 of the conductive structure 12 may cover the waveguide 60. An end of the waveguide 60 may be exposed from a lateral side surface of the dielectric structure 121 of the conductive structure 12.

The solder bumps 81 (e.g., solder balls) are mounted on the bonding pads 33 of the redistribution structure 30 for external connection.

Figure 2:
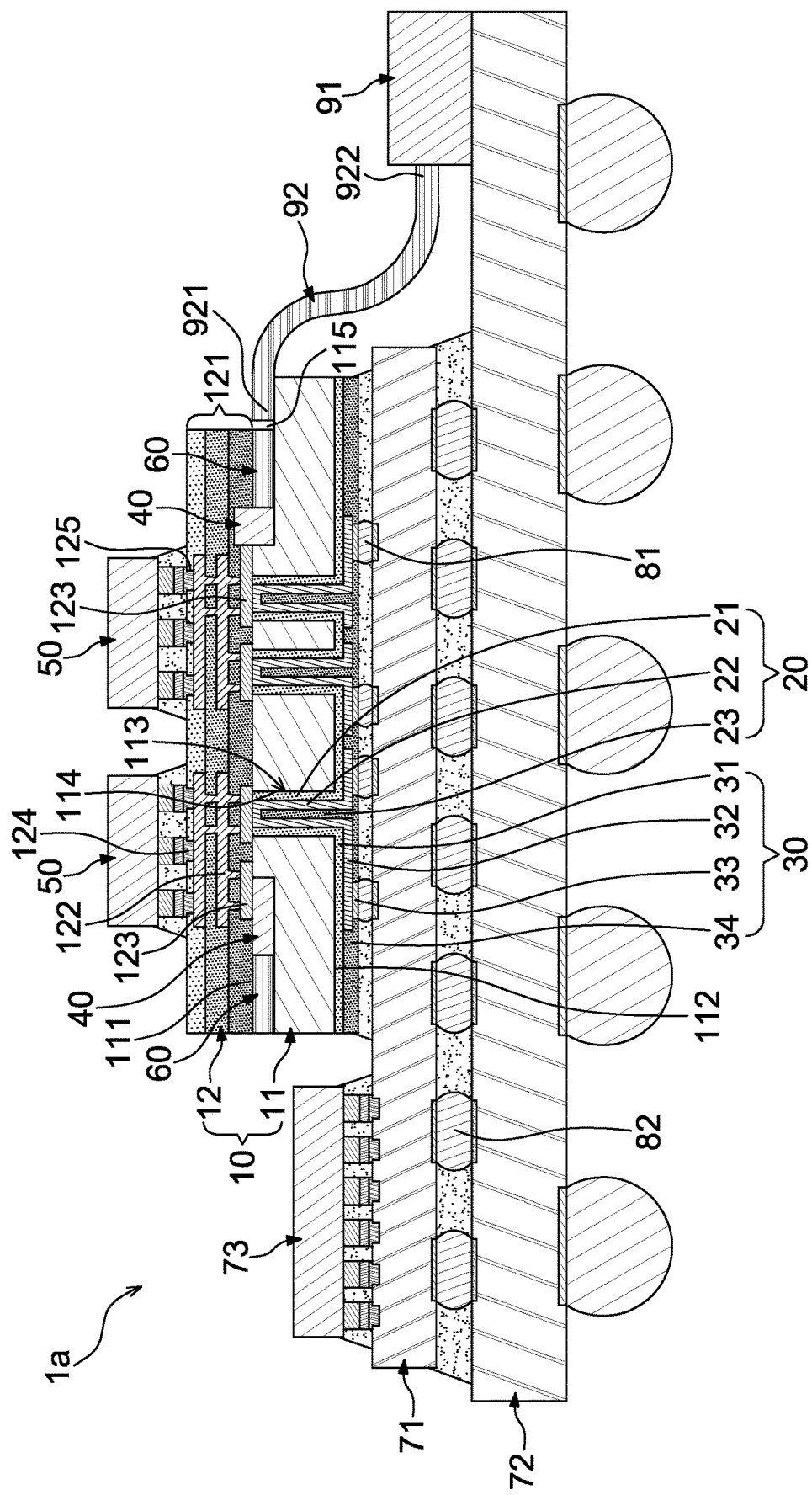
FIG. 2 illustrates a cross-sectional view of an optical communication package structure according to some embodiments of the present disclosure.

FIG. 2 illustrates a cross-sectional view of an optical communication package structure 1*a* according to some embodiments of the present disclosure. The optical communication package structure 1*a* is similar to the optical communication package structure 1 shown in FIG. 1, except that the optical communication package structure 1*a* further includes a package substrate 71, a mother board 72, a switch device 73, a laser device 91 and at least one optical transmission element 92. In some embodiments, the redistribution structure 30 may be electrically connected to the package substrate 71 through the solder bumps 81. The switch device 73 may be disposed on and electrically connected to the package substrate 71 to perform data processing. In addition, the package substrate 71 may be disposed on and electrically connected to the mother board 72 through a plurality of solder bumps 82. The laser device 91 may be disposed on and electrically connected to the mother board 72. The optical transmission element 92 has a first end 921 coupling to the optical device 40 and a second end 922 coupling to the laser device 91. In some embodiments, the optical transmission element 92 may be an optical fiber.

In some embodiments, the first end 921 of the optical transmission element 92 may be disposed in the groove 115 of the main portion 11, and the waveguide 60 may be disposed between the optical device 40 and the first end 921 of the optical transmission element 92 for guiding the light from the optical transmission element 92 into the optical device 40.

In the optical communication package structure 1*a*, the light from the laser device 91 is coupled into the optical transmission element 92. After the optical transmission element 92 transmits the light for a distance, the light is coupled into the waveguide 60 from the first end 921 of the optical transmission element 92. Then, the light is coupled to the optical device 40 from one end of the waveguide 60. The optical device 40 such as a photo detector may convert the light into a current signal, and the electrical device 50 such as a trans-impedance amplifier (TIA) may convert the current signal into a voltage signal. The switch device 73 may process the voltage signal. Another electrical device 50 such as a driver may apply a bias on the voltage signal to drive a laser diode as a transmitter.

FIG. 3 through FIG. 16 illustrate a method for manufacturing an optical communication package structure according to some embodiments of the present disclosure. In some embodiments, the method is for manufacturing an optical communication package structure such as the optical communication package structure 1 shown in FIG. 1.

Figure 3:
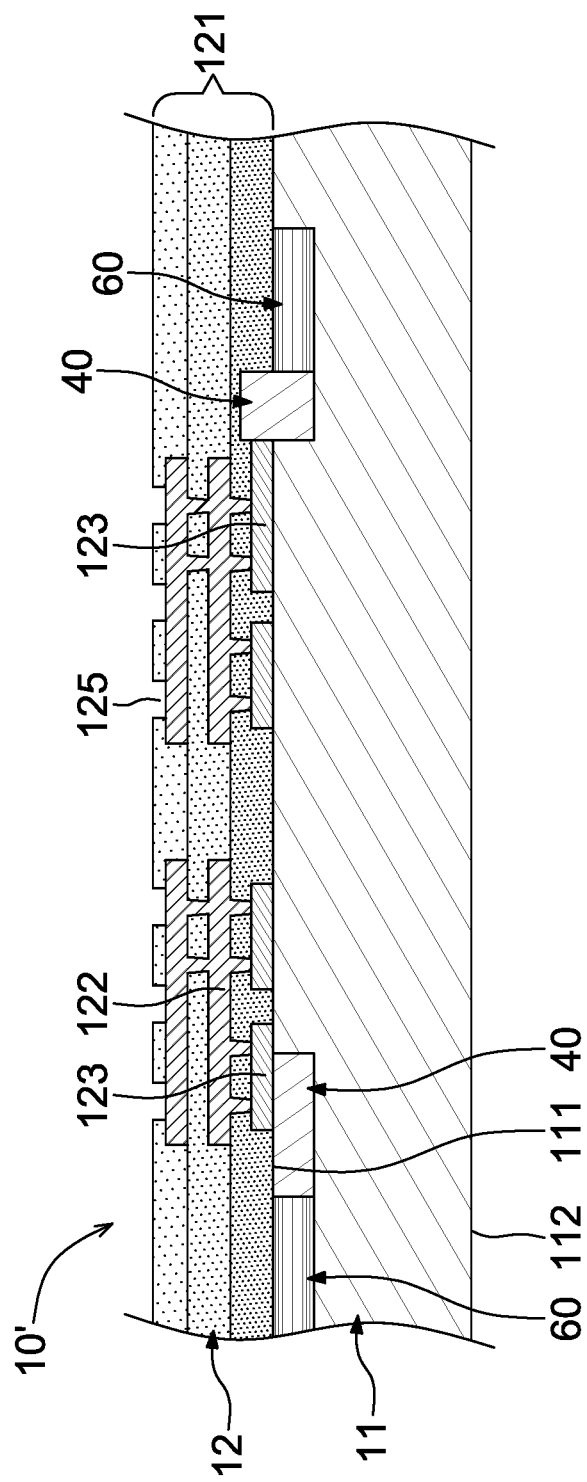
FIG. 3 illustrates one or more stages of an example of a method for manufacturing an optical communication package structure according to some embodiments of the present disclosure.
Figure 4:
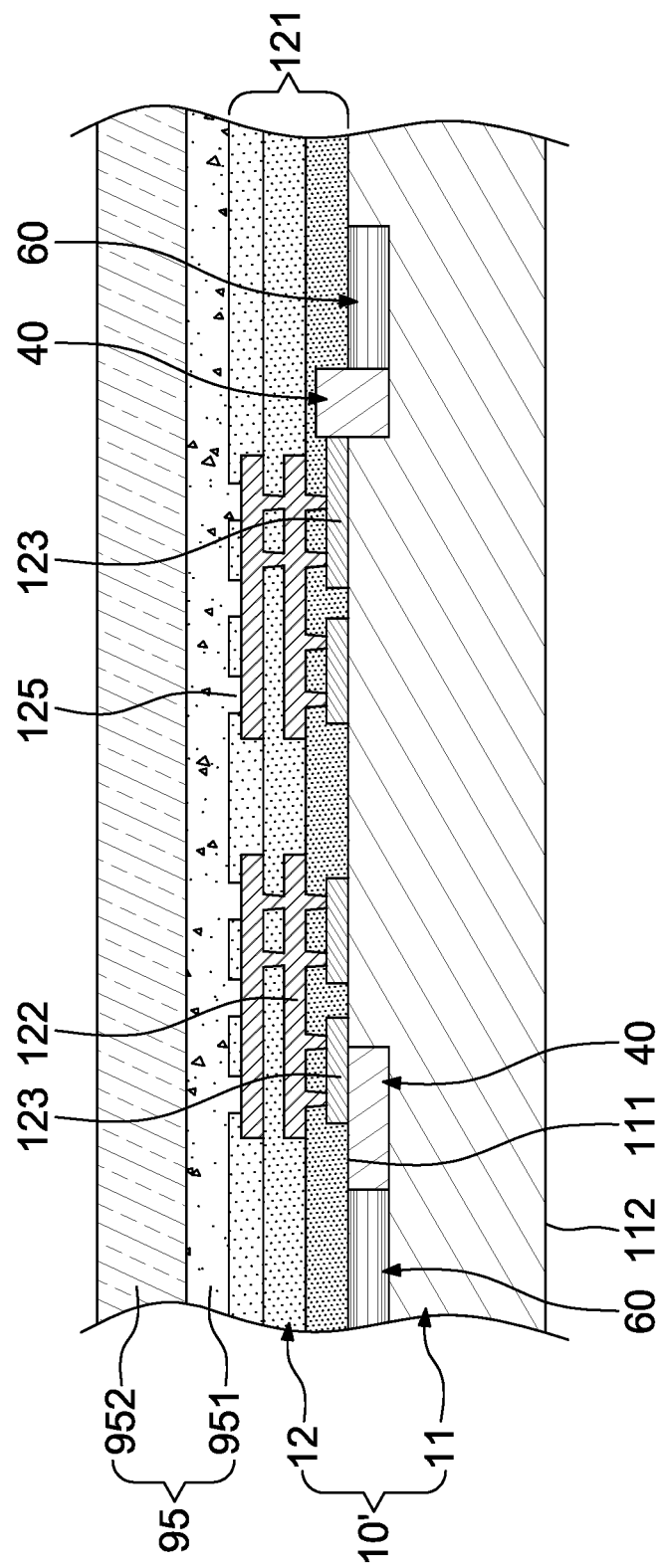
FIG. 4 illustrates one or more stages of an example of a method for manufacturing an optical communication package structure according to some embodiments of the present disclosure.
Figure 5:
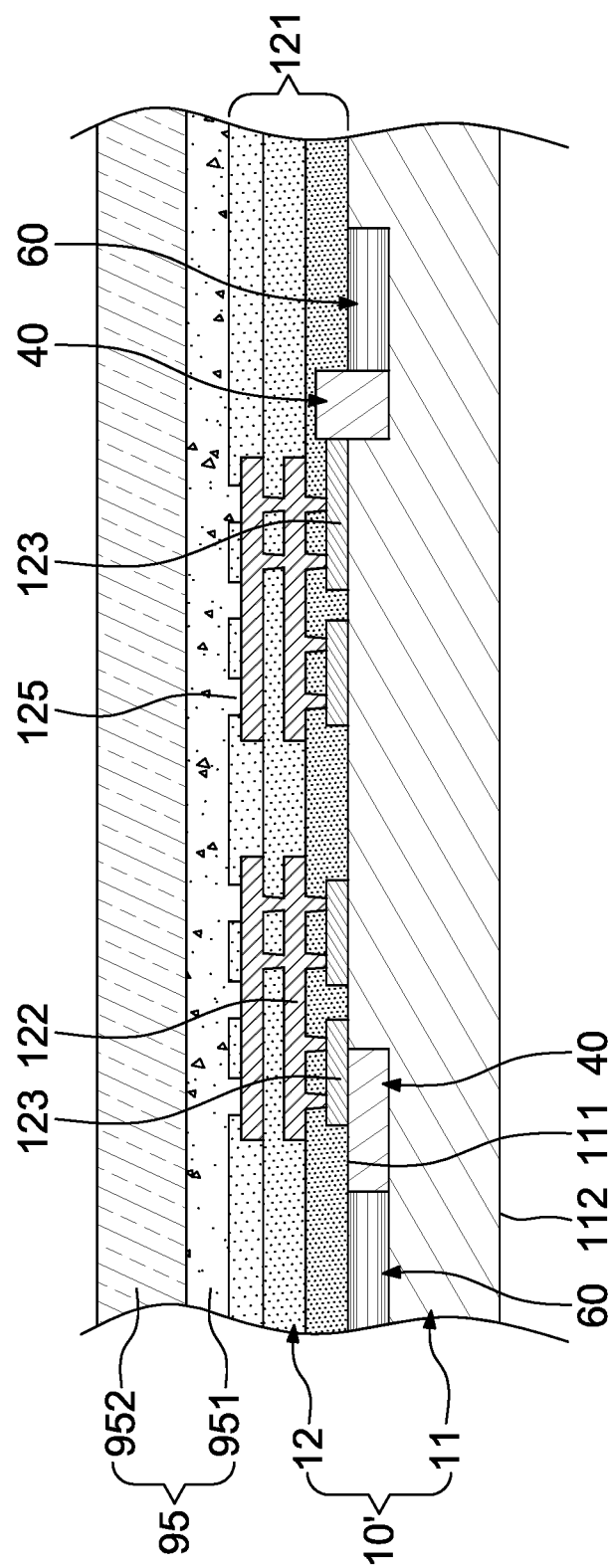
FIG. 5 illustrates one or more stages of an example of a method for manufacturing an optical communication package structure according to some embodiments of the present disclosure.

Referring to FIG. 3 through FIG. 5, a wafer 10' is provided. Referring to FIG. 3, the wafer 10' includes a main portion 11 and a conductive structure 12. The main portion 11 has an upper surface 111 and a lower surface 112 opposite to the upper surface 11. In some embodiments, a material of the main portion 11 may include silicon. The conductive structure 12 is disposed on the upper surface 111 of the main portion 11. The conductive structure 12 includes a dielectric structure 121, at least one circuit layer 122 and at least one bonding pad 123. The dielectric structure 121 covers the upper surface 111 of the main portion 11, and includes a plurality of dielectric layers stacked on one another. A material of the dielectric layers is different from a material of the main portion 11. The at least one circuit layer 122 is embedded in the dielectric layers of the dielectric structure 121. In some embodiments, the at least one circuit layer 122 may include a plurality of circuit layers 122 electrically connected to each other through a plurality of inner vias. The at least one bonding pad 123 is disposed adjacent to or disposed on the upper surface 111 of the main portion 11 and electrically connected to the circuit layer 122 through the inner vias. In some embodiments, the at least one bonding pad 123 may include a plurality of bonding pads 123 disposed adjacent to or exposed from a lower surface of the conductive structure 12. In some embodiments, the bonding pads 123 may be a portion of a circuit layer. In some embodiments, the dielectric structure 121 defines a plurality of openings 125 to expose a portion of the topmost circuit layer 122.

In some embodiments, the wafer 10' may further include at least one optical device 40 and at least one waveguide 60. The optical device 40 may be, for example, a photo detector, a laser diode or a modulator. The optical device 40 is disposed adjacent to the upper surface 111 of the main portion 11 and electrically connected to the at least one bonding pad 123 of the conductive structure 12. In some embodiments, the dielectric structure 121 of the conductive structure 12 may cover the optical device 40. In some embodiments, the optical device 40 may be disposed adjacent to the boundary between the dielectric structure 121 of the conductive structure 12 and the main portion 11. Thus, the optical device 40 may be embedded in the dielectric structure 121 of the conductive structure 12 and/or the main portion 11. The waveguide 60 is disposed adjacent to the upper surface 111 of the main portion 11 and corresponds to the optical device 40. In some embodiments, the dielectric structure 121 of the conductive structure 12 may cover the waveguide 60. An end of the waveguide 60 may be exposed from a lateral side surface of the dielectric structure 121 of the conductive structure 12.

Referring to FIG. 4, a carrier structure 95 is disposed on the wafer 10' to cover the conductive structure 12. In some embodiments, the carrier structure 95 may include an adhesive 951 covering the conductive structure 12 and a glass substrate 952 disposed on the adhesive 951. Thus, the conductive structure 12 of the wafer 10' is attached to the glass substrate 952 through the adhesive 951.

Referring to FIG. 5, the main portion 11 of the wafer 10' is thinned by, for example, grinding, from its lower surface 112. In some embodiments, the main portion 11 may be thinned to a thickness of about 75 μm to about 100 μm.

Figure 6:
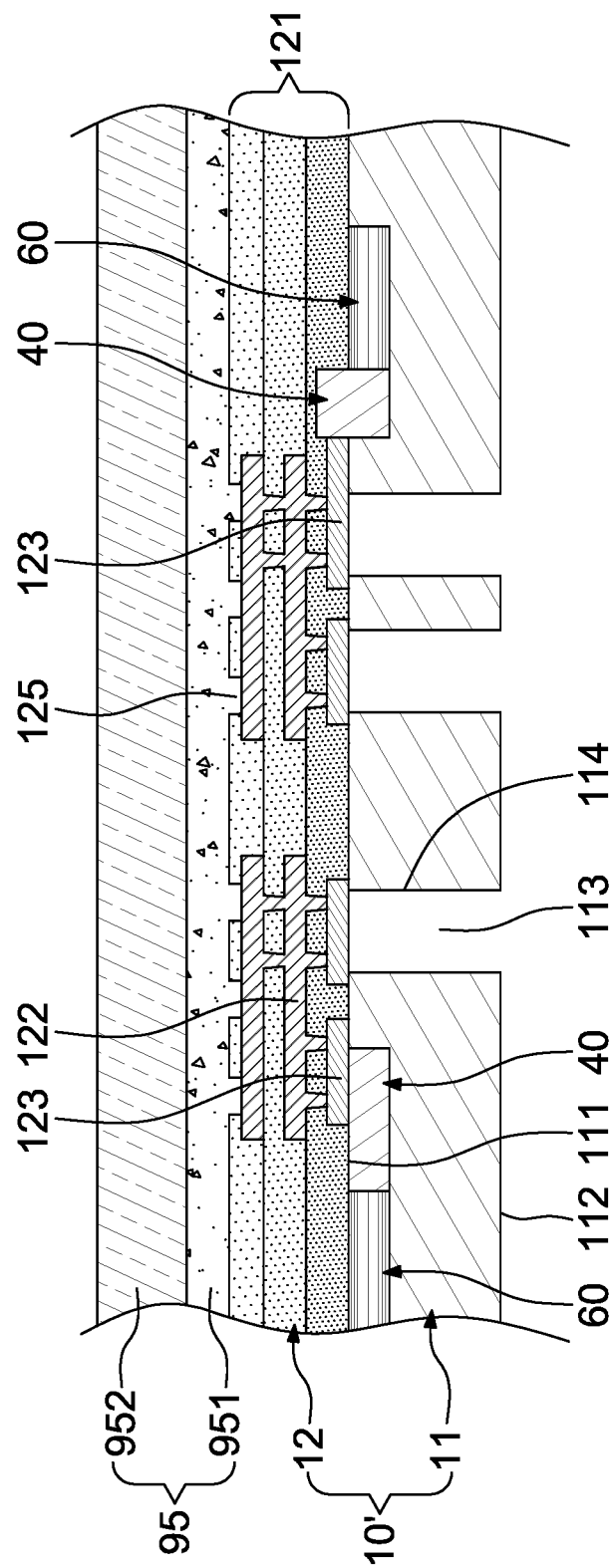
FIG. 6 illustrates one or more stages of an example of a method for manufacturing an optical communication package structure according to some embodiments of the present disclosure.

Referring to FIG. 6, at least one through hole 113 is formed to extend through the main portion 11 to expose a portion of the conductive structure 12 by, for example, photolithography process (e.g., including exposure and development) and dry etching, from the lower surface 112 of the main portion 11. The exposed portion of the conductive structure 12 may be a portion of the at least one bonding pad 123. In some embodiments, an aspect ratio of the through hole 113 may be less than or about equal to 1.66.

Figure 7:
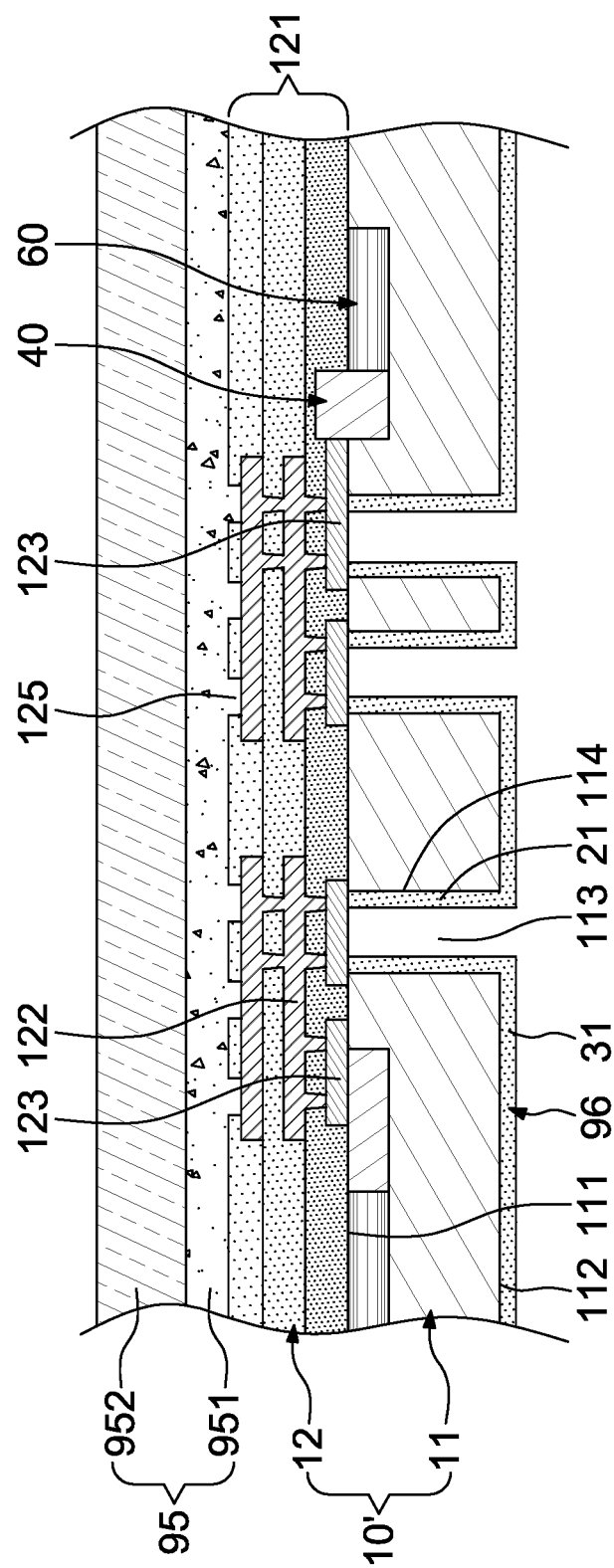
FIG. 7 illustrates one or more stages of an example of a method for manufacturing an optical communication package structure according to some embodiments of the present disclosure.
Figure 8:
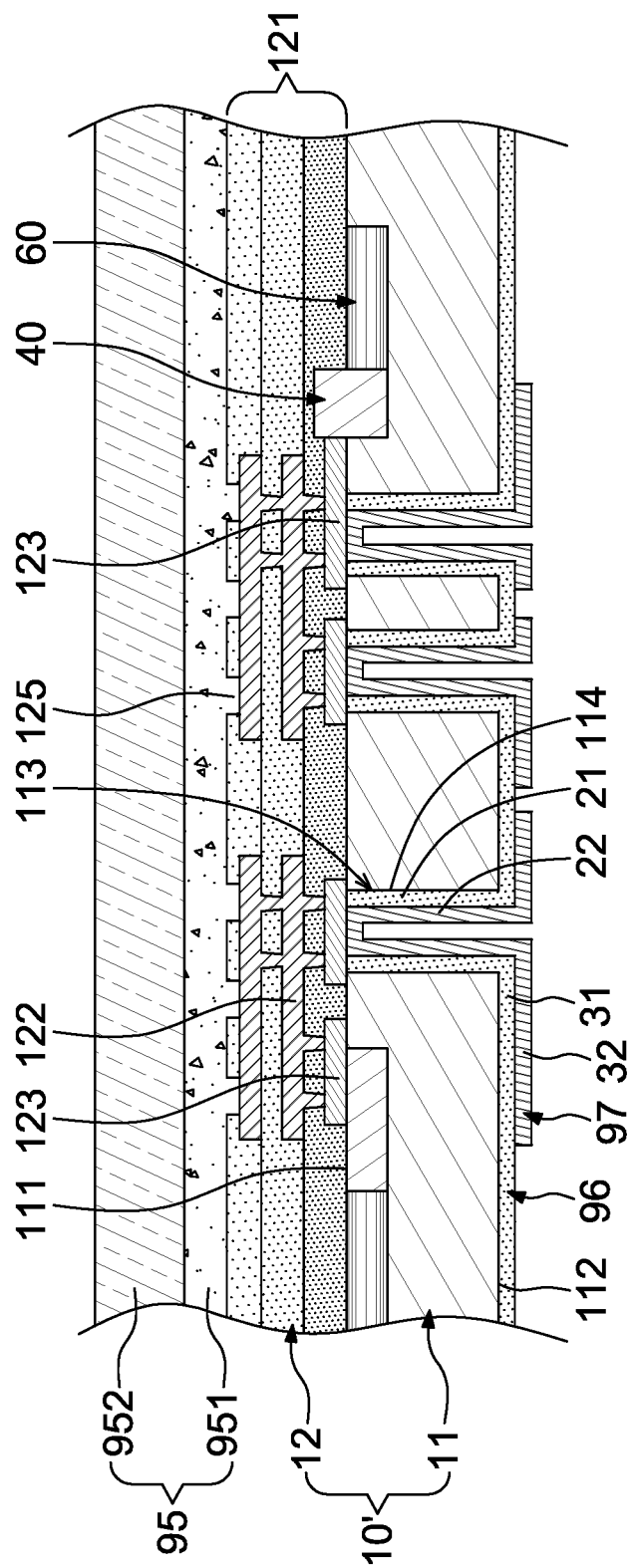
FIG. 8 illustrates one or more stages of an example of a method for manufacturing an optical communication package structure according to some embodiments of the present disclosure.
Figure 9:
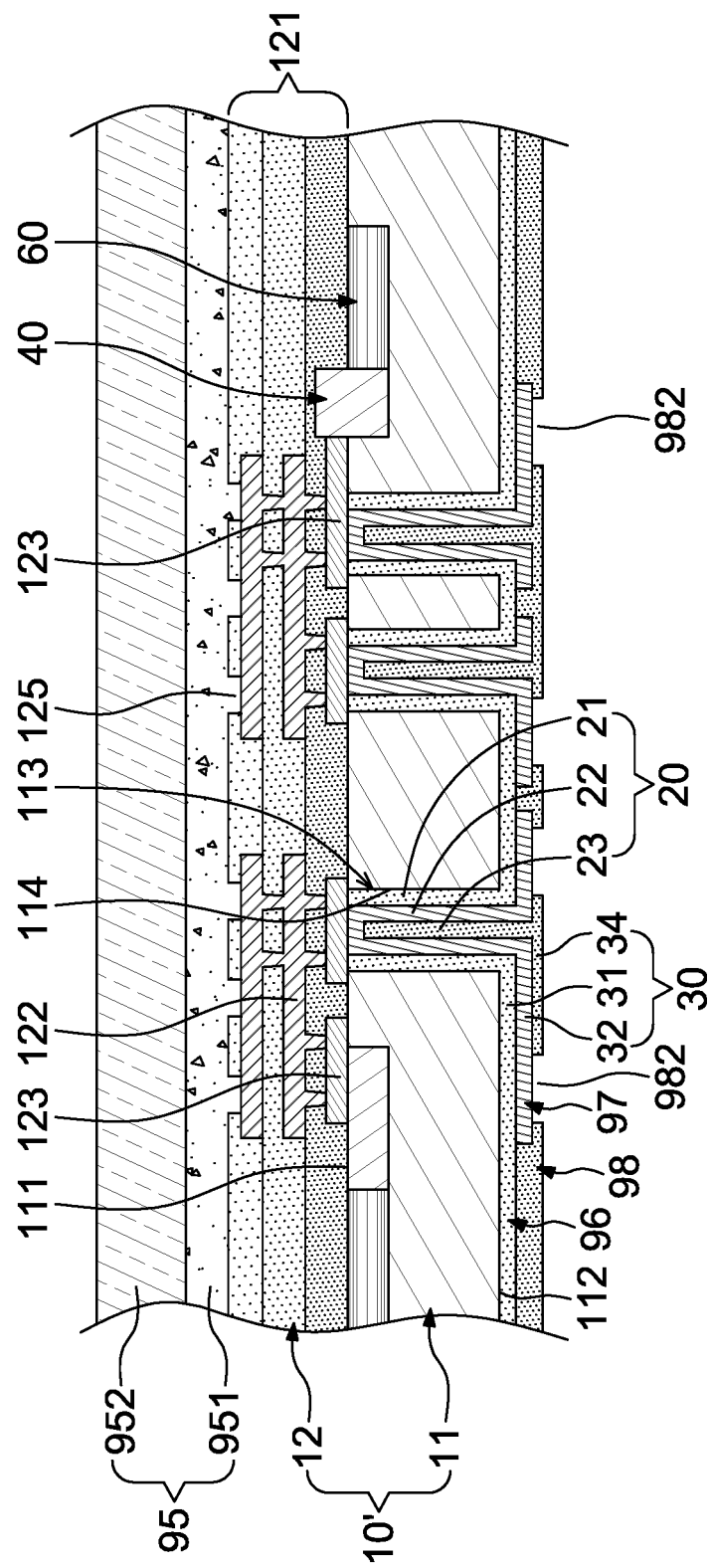
FIG. 9 illustrates one or more stages of an example of a method for manufacturing an optical communication package structure according to some embodiments of the present disclosure.

Referring to FIG. 7 through FIG. 11, at least one via structure 20 is formed in the at least one through hole 113 of the main portion 11 and a redistribution structure 30 is formed on the lower surface 112 of the main portion 11. Referring to FIG. 7, a first passivation material 96 is formed in the at least one through hole 113 of the main portion 11 and on the lower surface 112 of the main portion 11 by, for example, vacuum suction or chemical vapor deposition (CVD). The first passivation material 96 may be a dry film (attached by vacuum suction), a silicon oxide (formed by CVD), or a silicon nitride (formed by CVD). In some embodiments, a portion of the first passivation material 96 in the at least one through hole 113 may form a first passivation layer 21 of the via structure 20 (FIG. 9), and a portion of the first passivation material 96 on the lower surface 112 may form a first passivation layer 31 of the redistribution structure 30 (FIG. 9). It is noted that, in this stage, the first passivation layer 31 does not cover the bonding pad 123 completely. That is, a portion of the bonding pad 123 is exposed in the through hole 113.

Referring to FIG. 8, a metal material 97 is formed on the first passivation material 96 by, for example, electroplating. The metal material 97 may be copper or alloy. In some embodiments, a portion of the metal material 97 on the first passivation layer 21 may form a metal layer 22 of the via structure 20 (FIG. 9) and may define a central hole, and a portion of the metal material 97 on the first passivation layer 31 may be patterned to form a redistribution layer 32 of the redistribution structure 30 (FIG. 9).

Referring to FIG. 9, a second passivation material 98 is formed on the metal material 97 by, for example, vacuum suction. The second passivation material 98 may be a dry film. In some embodiments, a portion of the second passivation material 98 on the metal layer 22 may fill the central hole defined by the metal layer 22 to form a second passivation layer 23 of the via structure 20, and a portion of the second passivation material 98 on the redistribution layer 32 may form a second passivation layer 34 of the redistribution structure 30. Meanwhile, at least one via structure 20 (including the first passivation layer 21, the metal layer 22 and the second passivation layer 23) is formed. Since the via structure 20 is not formed together with or before the conductive structure 12 of the wafer 10' (e.g., the via structure 20 is formed after the formation of the conductive structure 12), the multi-stage heating process of manufacturing the conductive structure 12 of the wafer 10' may not damage the via structure 20. That is, the via structure 20 may not be influenced by the multi-stage heating process of manufacturing the conductive structure 12, and the yield of the via structure 20 is improved.

In addition, the second passivation material 98 may further define a plurality of openings 982 to expose a portion of the redistribution layer 32.

Figure 10:
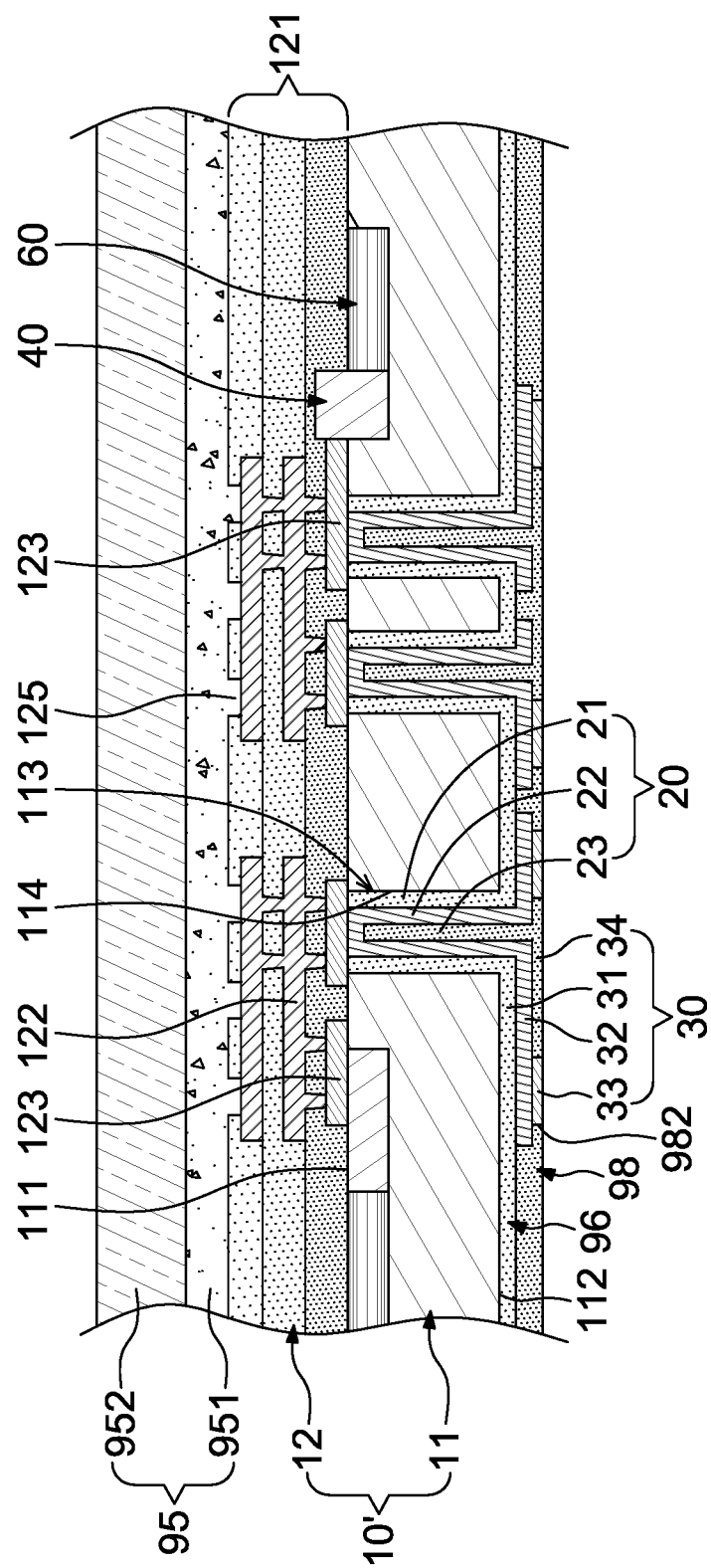
FIG. 10 illustrates one or more stages of an example of a method for manufacturing an optical communication package structure according to some embodiments of the present disclosure.

Referring to FIG. 10, a plurality of bonding pads 33 are formed in the openings 982 and on the redistribution layer 32. Thus, the first passivation layer 31, the redistribution layer 32, the bonding pads 33 and the second passivation layer 34 may constitute the redistribution structure 30.

Figure 11:
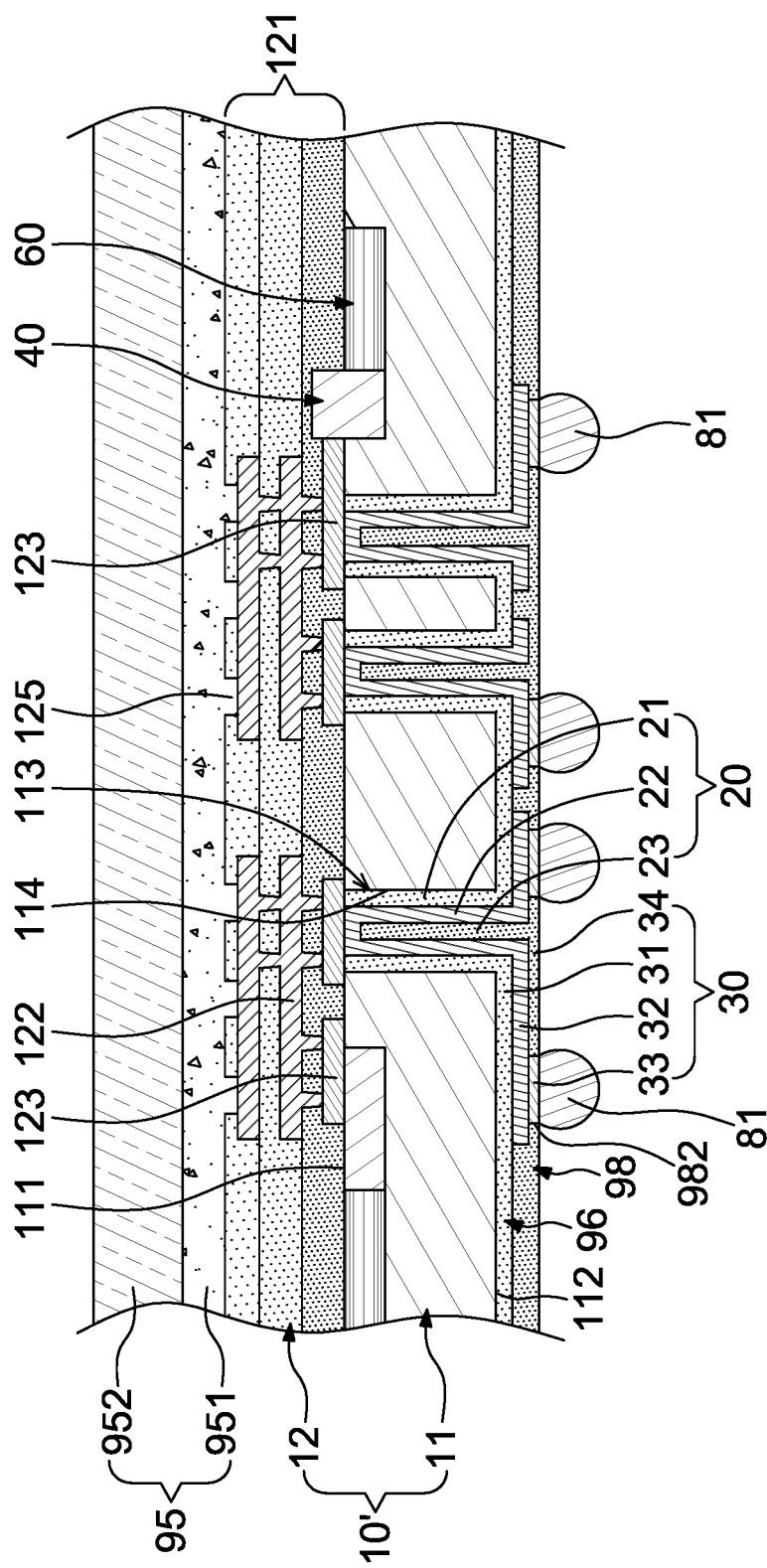
FIG. 11 illustrates one or more stages of an example of a method for manufacturing an optical communication package structure according to some embodiments of the present disclosure.

Referring to FIG. 11, a plurality of solder bumps 81 (e.g., solder balls) are formed on the bonding pads 33 for external connection.

Figure 12:
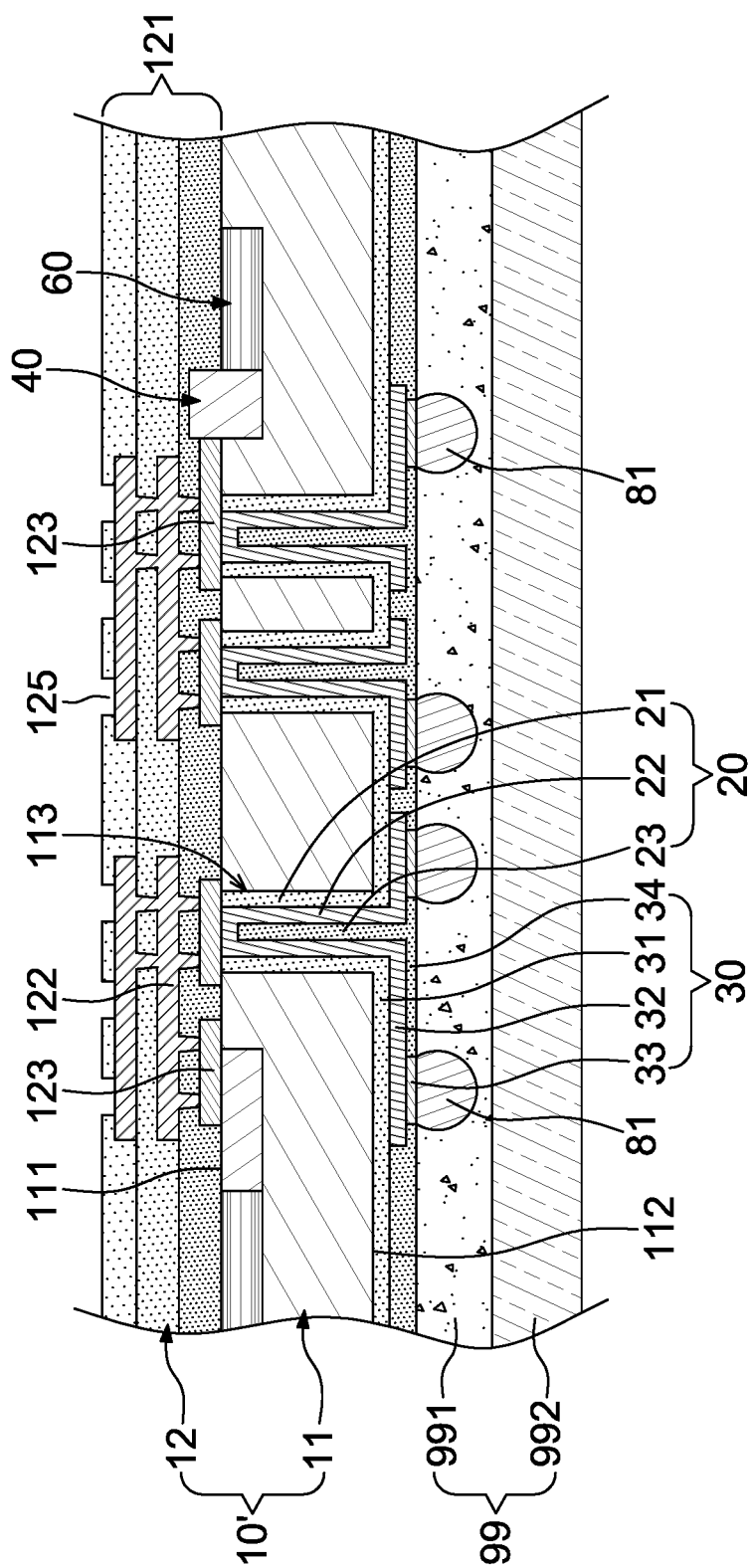
FIG. 12 illustrates one or more stages of an example of a method for manufacturing an optical communication package structure according to some embodiments of the present disclosure.

Referring to FIG. 12 through FIG. 15, at least one electrical device 50 is electrically connected to the conductive structure 12. The electrical device 50 may be, for example, a trans-impedance amplifier (TIA) or a driver. Referring to FIG. 12, the redistribution structure 30 on the wafer 10' is disposed on a carrier structure 99. In some embodiments, the carrier structure 99 may include an adhesive 991 attached to the redistribution structure 30 and a glass substrate 992 covering the adhesive 991. That is, the redistribution structure 30 on the wafer 10' is attached to the glass substrate 992 through the adhesive 991.

Then, the carrier structure 95 (including the glass substrate 952 and the adhesive 951) is removed.

Figure 13:
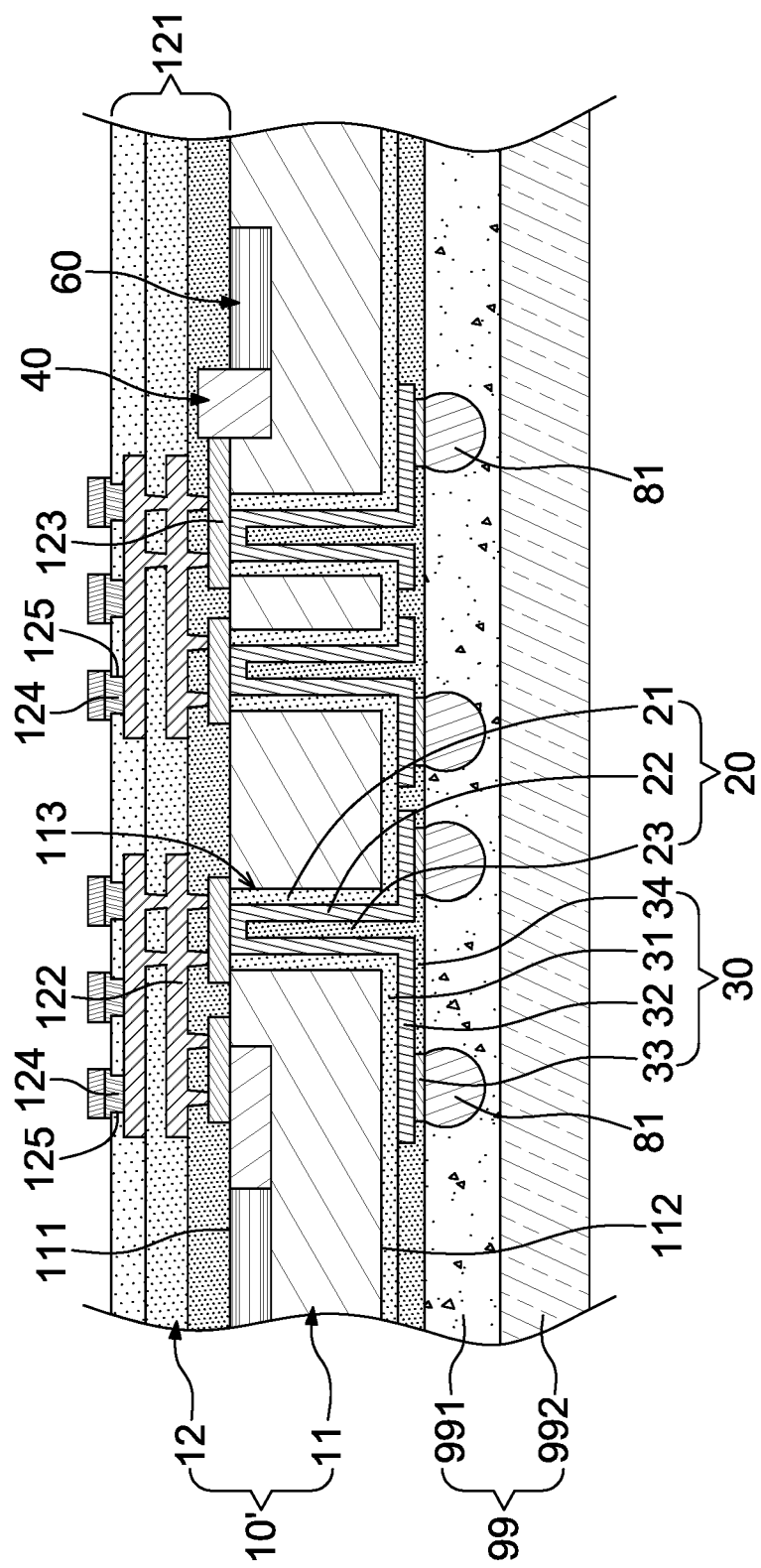
FIG. 13 illustrates one or more stages of an example of a method for manufacturing an optical communication package structure according to some embodiments of the present disclosure.

Referring to FIG. 13, a plurality of metal bumps 124 are formed in the openings 125 and on the topmost circuit layer 122. Each of the metal bumps 124 may be a single-layered structure or a multi-layered structure. Further, the metal bumps 124 may protrude from the upper surface of the conductive structure 12.

Figure 14:
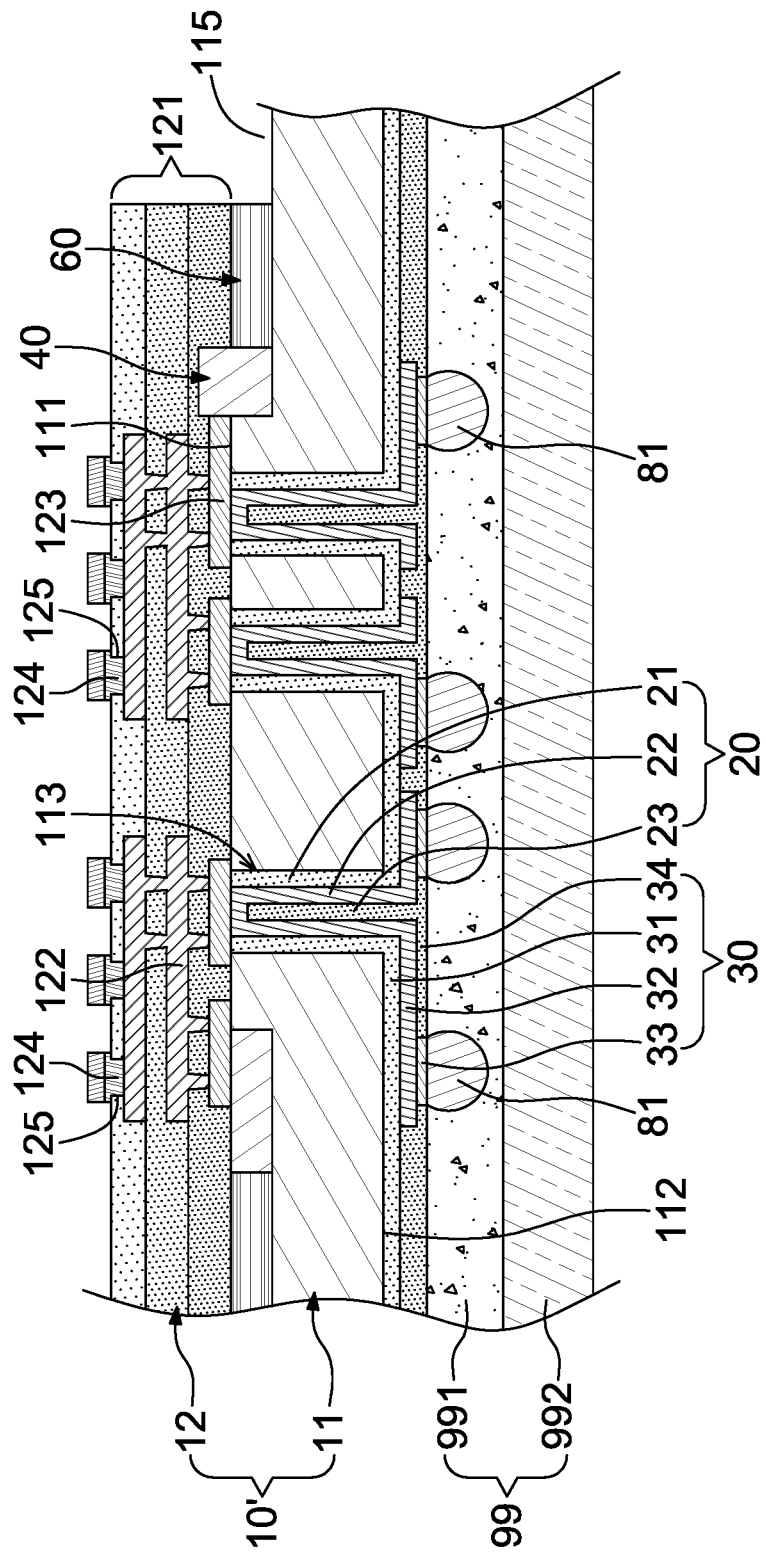
FIG. 14 illustrates one or more stages of an example of a method for manufacturing an optical communication package structure according to some embodiments of the present disclosure.

Referring to FIG. 14, at least one groove 115 is formed on the main portion 11 from the upper surface 111 of the main portion 11 by, for example, dry etching or wet etching. The groove 115 may be recessed from the upper surface 111 of the main portion 11. Meanwhile, a portion of the dielectric structure 121 may be removed to expose the groove 115. In some embodiments, the groove 115 may be a V-groove. In addition, an end of the waveguide 60 may be exposed from a lateral side surface of the dielectric structure 121 of the conductive structure 12, and may be exposed in the groove 115.

Figure 15:
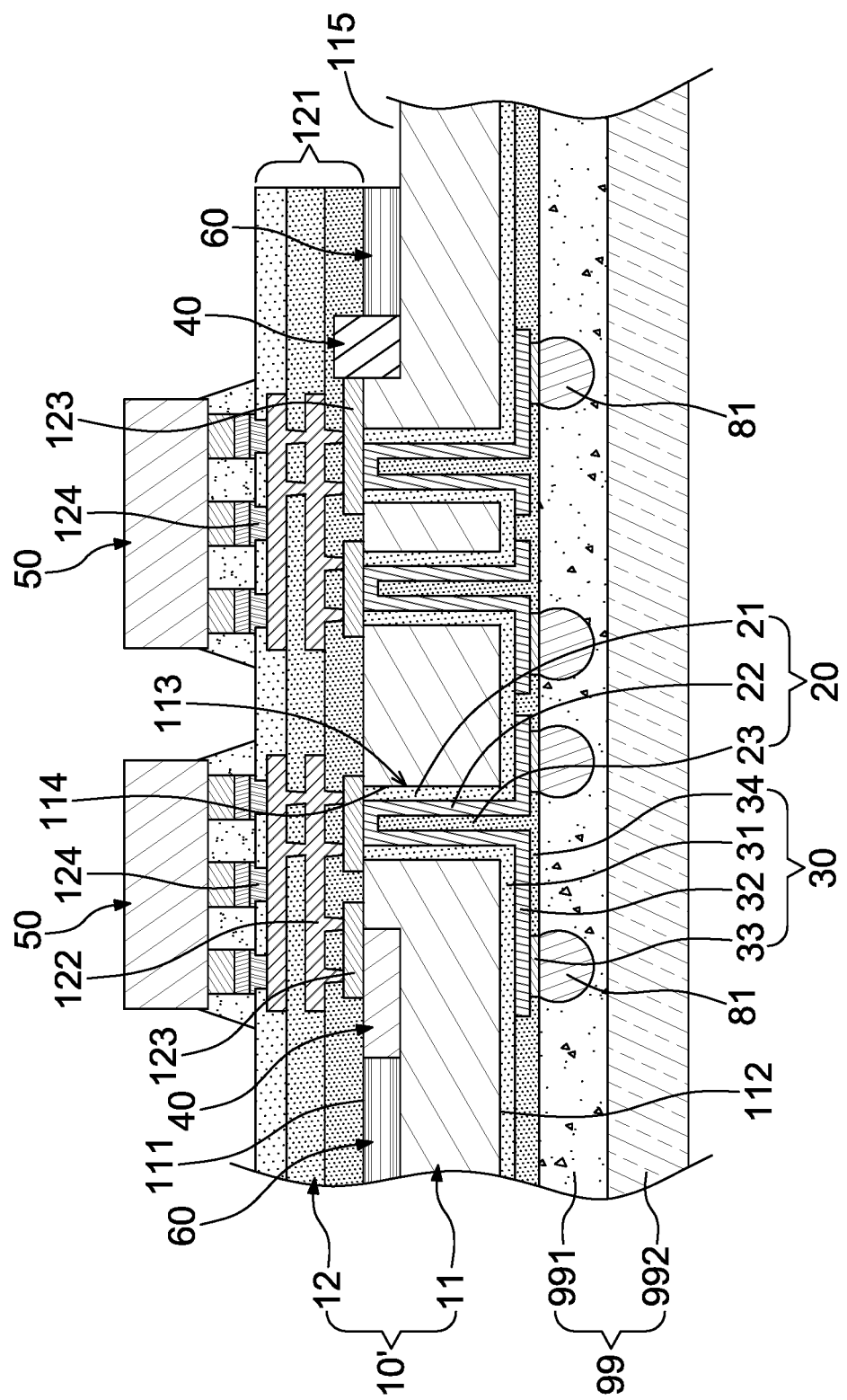
FIG. 15 illustrates one or more stages of an example of a method for manufacturing an optical communication package structure according to some embodiments of the present disclosure.

Referring to FIG. 15, the electrical device 50 is bonded to the metal bumps 124 by, for example, flip chip bonding.

Figure 16:
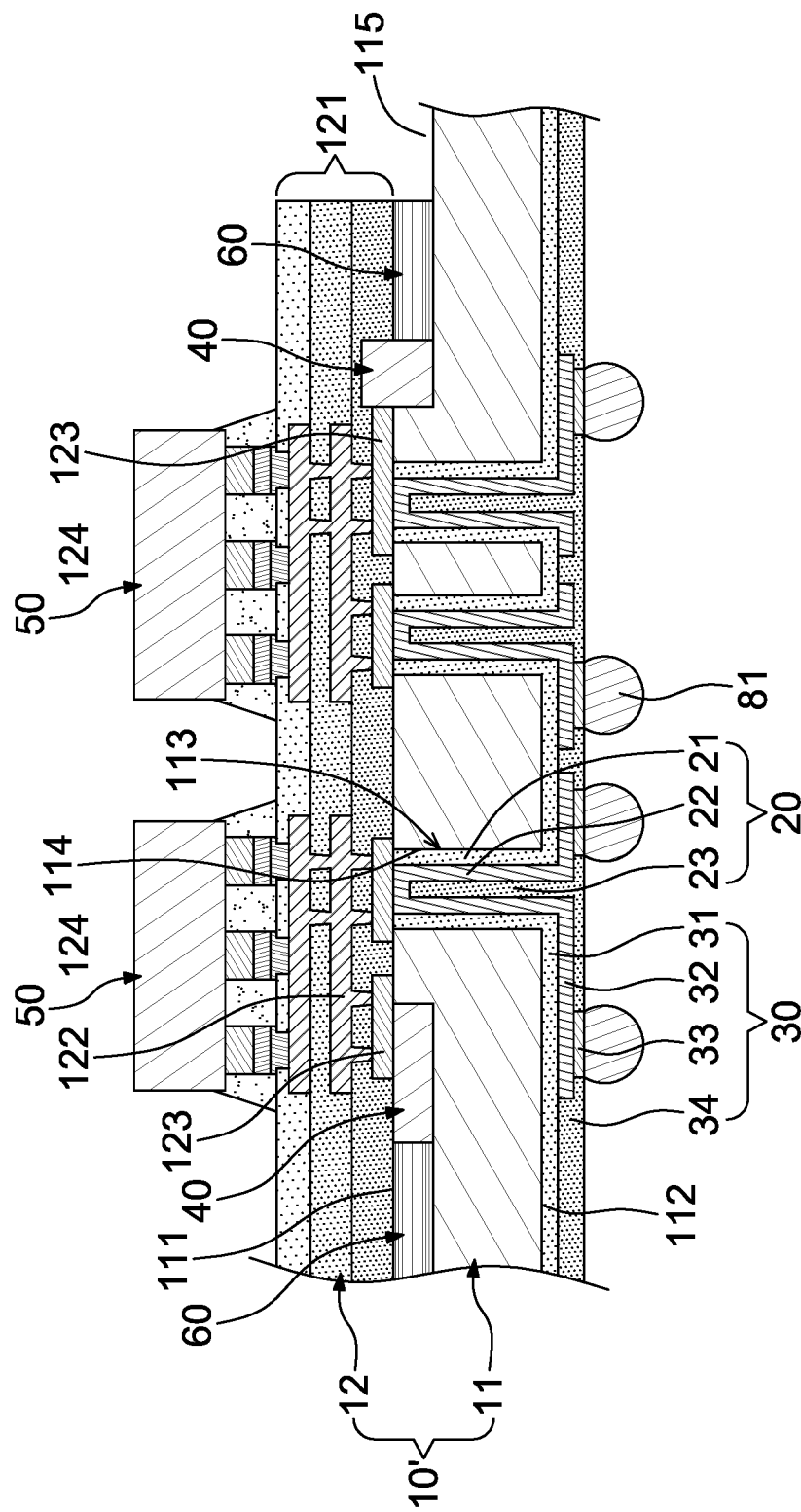
FIG. 16 illustrates one or more stages of an example of a method for manufacturing an optical communication package structure according to some embodiments of the present disclosure.

Referring to FIG. 16, the carrier structure 99 (including the glass substrate 992 and the adhesive 991) is removed after the electrical device 50 is electrically connected to the conductive structure 12 (e.g., bonded to the metal bumps 124). Then, a singulation process is conducted to obtain a plurality of optical communication package structures 1 of FIG. 1.

Figure 17:
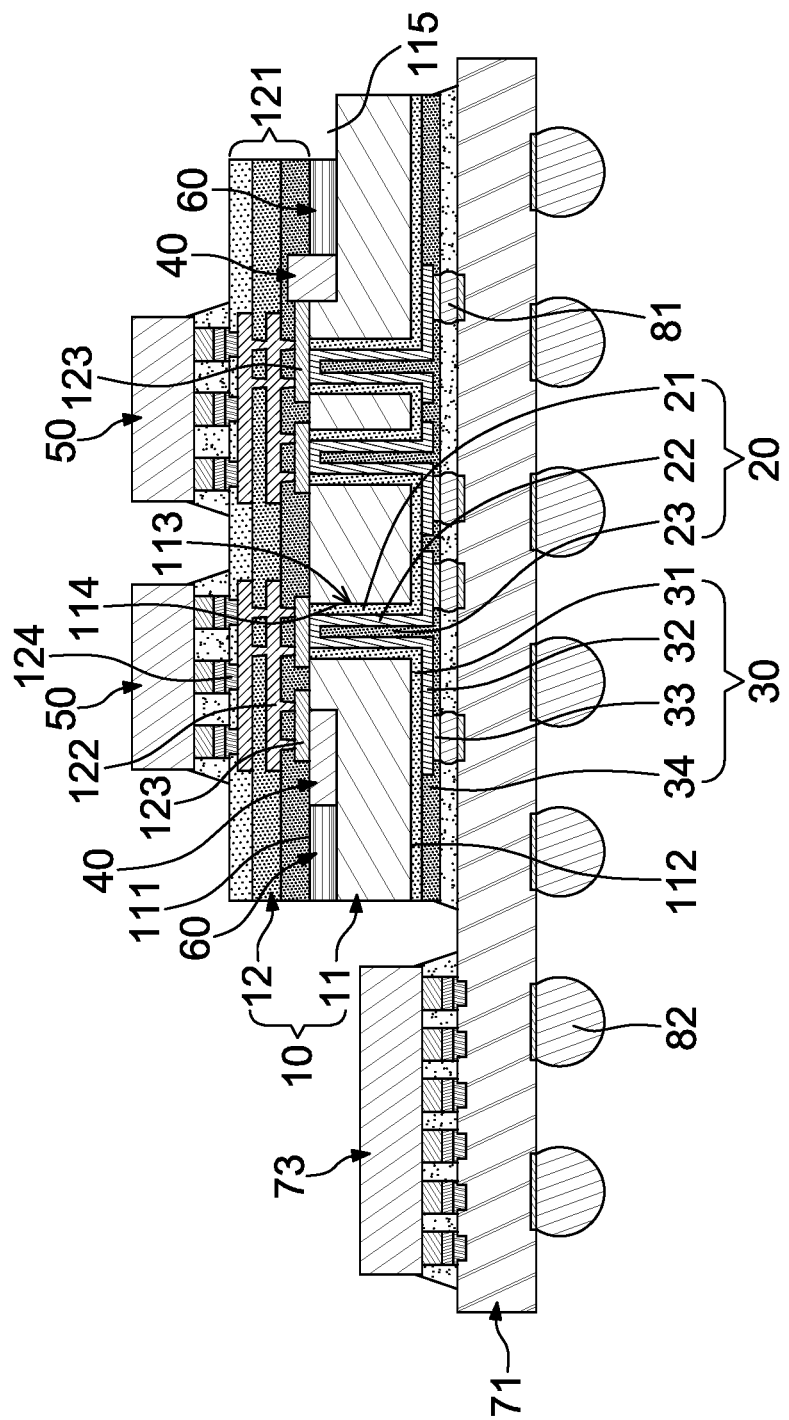
FIG. 17 illustrates one or more stages of an example of a method for manufacturing an optical communication package structure according to some embodiments of the present disclosure.
Figure 18:
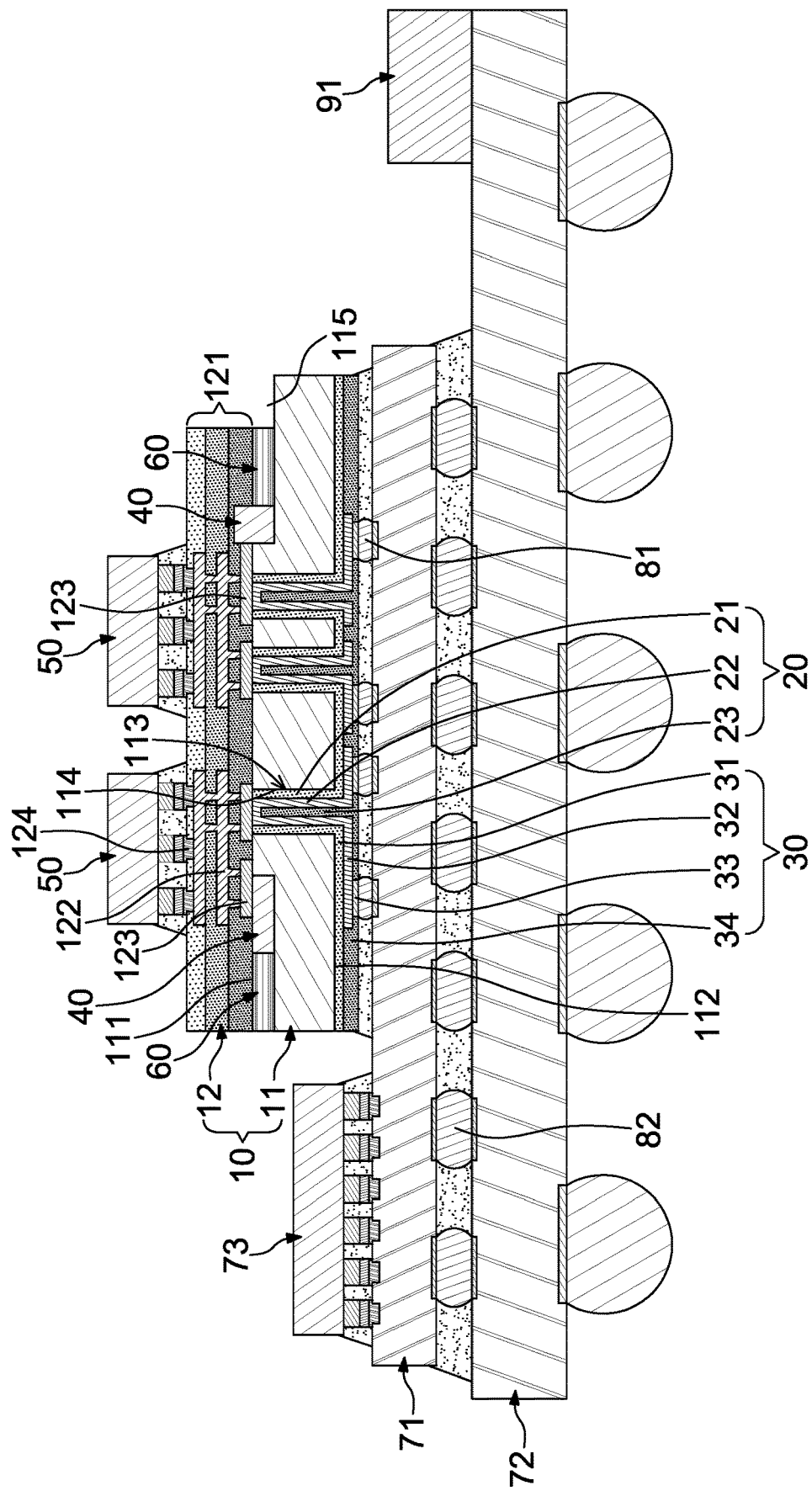
FIG. 18 illustrates one or more stages of an example of a method for manufacturing an optical communication package structure according to some embodiments of the present disclosure.

FIG. 17 through FIG. 18 illustrate a method for manufacturing an optical communication package structure according to some embodiments of the present disclosure. In some embodiments, the method is for manufacturing an optical communication package structure such as the optical communication package structure 1a shown in FIG. 2. The initial several stages of the illustrated process are the same as, or similar to, the stages illustrated in FIG. 3 through FIG. 16. FIG. 17 depicts a stage subsequent to that depicted in FIG. 16.

Referring to FIG. 17, the redistribution structure 30 of the optical communication package structure 1 is electrically connected to a package substrate 71 through the solder bumps 81. That is, the optical communication package structure 1 is bonded to the package substrate 71 by flip-chip bonding. In some embodiments, a switch device 73 may be disposed on and electrically connected to the package substrate 71 by flip-chip bonding to perform data processing. In addition, a plurality of solder bumps 82 may be formed on the package substrate 71 for external connection.

Referring to FIG. 18, the package substrate 71 accompanying with the optical communication package structures 1 and the switch device 73 is electrically connected to a mother board 72 through the solder bumps 82. Then, a laser device 91 may be disposed on and electrically connected to the mother board 72. Then, at least one optical transmission element 92 is disposed in the groove 115 of the main portion 11, so as to obtain the optical communication package structure 1a of FIG. 2. The optical transmission element 92 has a first end 921 coupling to the optical device 40 and a second end 922 coupling to the laser device 91. In some embodiments, the optical transmission element 92 may be an optical fiber. In some embodiments, the first end 921 of the optical transmission element 92 may be disposed in the groove 115 of the main portion 11, and the waveguide 60 may be disposed between the optical device 40 and the first end 921 of the optical transmission element 92 for guiding the light from the optical transmission element 92 into the optical device 40.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm. A surface can be deemed to be substantially flat if a displacement between a highest point and a lowest point of the surface is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. An optical device, comprising:
    an optical carrier having a first surface and a second surface opposite to the first surface;
    a circuit structure disposed adjacent to the first surface of the optical carrier, wherein a lateral surface of the circuit structure is misaligned with a lateral surface of the optical carrier;
    a through via extending between the first surface and the second surface; and
    a bonding pad disposed adjacent to the second surface of the optical carrier;
    wherein the bonding pad is misalignment with a downward projection area of the through via, the lateral surface of the circuit structure is recessed inward from the lateral surface of the optical carrier, the optical carrier defines a third surface extending from the lateral surface of the circuit structure to the lateral surface of the optical carrier, and the third surface is configured to support a fiber coupling with a waveguide.

2. The optical device of claim 1, further comprising a redistribution structure disposed on the second surface and electrically connecting the bonding pad to the through via.

3. The optical device of claim 1, further comprising a redistribution structure, wherein the redistribution structure extends into the through via and is electrically connected to the circuit structure.

4. The optical device of claim 1, wherein the waveguide is disposed adjacent to the through via and the first surface.

5. The optical device of claim 4, wherein a top surface of the waveguide is substantially level with a top surface of the through via.

6. The optical device of claim 4, wherein the waveguide is exposed from a side surface extending between the first surface and the second surface.

7. The optical device of claim 1, further comprising a redistribution structure, wherein the redistribution structure is disposed on the second surface and electrically connects the bonding pad to the through via, the redistribution structure extends into the through via and is electrically connected to the circuit structure, and waveguide is disposed adjacent to the through via and the first surface.

* * * * *